United States Patent
Niemi et al.

(10) Patent No.: US 6,201,876 B1
(45) Date of Patent: *Mar. 13, 2001

(54) DEVICE FOR PROTECTING A MICROPHONE FROM EXTERNAL DISTURBANCES

(75) Inventors: Mikko Niemi, Raikku; Jukka Eerikäinen, Tampere, both of (FI)

(73) Assignee: Nokia Mobile Phones Ltd., Espoo (FI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/015,572

(22) Filed: Jan. 30, 1998

(30) Foreign Application Priority Data

Jan. 31, 1997 (FI) ........................................ 970409

(51) Int. Cl.[7] ................................................. H04R 25/00
(52) U.S. Cl. ........................................ 381/355; 381/361
(58) Field of Search ........................ 381/355, 359, 381/360, 361, FOR 147, FOR 148, 322, 191, 365; 361/818, 816, 814

(56) References Cited

U.S. PATENT DOCUMENTS

| 4,500,595 | 2/1985 | Gerteisen et al. .................. 428/294 |
|---|---|---|
| 4,533,795 | 8/1985 | Baumhauer, Jr. et al. ........ 179/111 E |
| 4,912,604 | 3/1990 | Vaisanen ............................... 361/424 |
| 4,945,633 | 8/1990 | Hakanen et al. ...................... 29/825 |
| 4,983,148 | 1/1991 | Nakagawa ............................ 474/263 |
| 5,006,667 | 4/1991 | Lonka ................................ 174/35 R |
| 5,271,056 | 12/1993 | Pesola et al. .......................... 379/58 |
| 5,284,888 | 2/1994 | Morgan ................................. 524/93 |
| 5,365,410 | 11/1994 | Lonka ................................... 361/816 |
| 5,400,949 | 3/1995 | Hirvonen et al. .............. 228/180.22 |
| 5,442,521 | 8/1995 | Hirvonen et al. ..................... 361/800 |
| 5,603,103 | 2/1997 | Halttenen et al. ...................... 455/90 |
| 5,640,457 | * 6/1997 | Gnecco ................................. 381/322 |
| 5,687,470 | 11/1997 | Halttunen et al. .................. 29/592.1 |
| 5,708,720 | * 1/1998 | Meyer ................................... 381/322 |

FOREIGN PATENT DOCUMENTS

| 3024261 A1 | 1/1982 | (DE) . |
| 91 15 132 U | 4/1992 | (DE) . |
| 06078040 | 3/1994 | (JP) . |
| 07336262 | 12/1995 | (JP) . |

* cited by examiner

Primary Examiner—Huyen Le
(74) Attorney, Agent, or Firm—Perman & Green, LLP

(57) ABSTRACT

The invention relates to a method for protecting a microphone (15) installed in an apparatus against external disturbances and to a disturbance eliminator particularly for a microphone. In accordance with the invention, the microphone (15) is encased in an electrically conducting casing (1), the wall (8) of which is formed of at least two layers of elastic material (81, 82), of which the first layer (81) is of insulating material and the second layer (82) is of conducting material.

5 Claims, 3 Drawing Sheets

DEVICE FOR PROTECTING A MICROPHONE FROM EXTERNAL DISTURBANCES

BACKGROUND OF THE INVENTION

1. Field of the Invention

The invention relates to a device for protecting a microphone against external disturbances, such as electromagnetic interference and noise and quick changes of temperature, as well as moisture and dust.

2. Description of the Related Art

In the protection of microphones, a problem is found particularly in achieving effective protection against electromagnetic coupling by means of an arrangement which should be as small and simple as possible. Electro Magnetic Compatibility, EMC, is particularly important in a mobile station, because a mobile station can be used in very variable and demanding environments.

There is a prior art device for protecting microphones from disturbances which consists of a metal screen or a plastic screen coated with metal, such as copper. When the microphone to be protected is small, the protecting device must consist of a very small piece of screen, which is difficult to handle in an industrial production process. Installing the piece of screen together with the microphone in the apparatus requires great accuracy and is thus demanding work. The success of the protection is in this case dependent on the joints between the protective frame of the microphone and the protective screen, and the results can vary if the protective screen cannot be installed accurately enough.

Using a protective screen to protect a microphone from disturbances does not provide protection against quick changes of temperature. Protection against noise conducted via the casing and frame of the apparatus is also needed.

In another prior art method, the microphone is placed deep inside the apparatus so that the air passage becomes long. Thus the electrostatic disturbances cannot break the microphone. This solution requires a lot of space in the apparatus and affects the sound quality.

The purpose of the present invention is to create a solution for protecting the microphone against external disturbances, in which solution the above mentioned drawbacks of the prior art can be avoided.

BRIEF SUMMARY OF THE INVENTION

The device according to the invention is characterized by the features that are presented in the characterizing part of claim 1. The preferred embodiments of the invention are presented in the dependent claims.

The invention provides the advantage that the microphone is protected both against electromagnetic disturbances and sound disturbances. Besides these, the microphone becomes protected against the following environmental effects: quick changes of temperature, moisture and dust.

The basic idea of the invention is that a uniform, efficient protection is formed around the microphone, by which protection disturbances are prevented from entering the microphone.

The disturbance eliminator according to the invention is a protective casing, which consists of two, preferably interconnected parts: cage and lid. The walls of the cage are preferably made of elastic material, such as silicone rubber. The walls include both an insulating and conducting layer of material.

BRIEF DESCRIPTION OF THE DRAWINGS

In the following, the invention will be described in more detail with reference to the accompanying drawings, in which.

Figure 1:
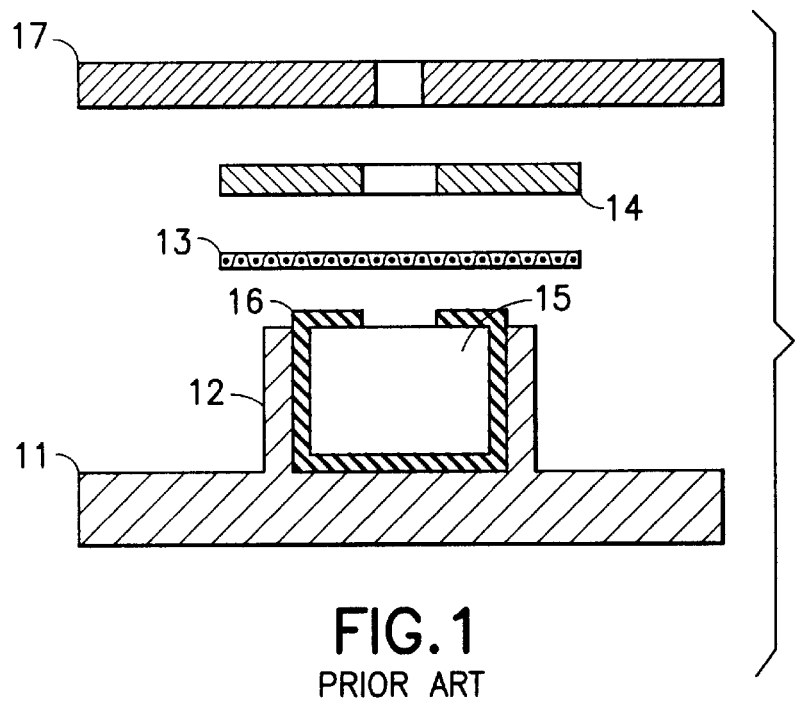
FIG. 1 shows an exploded view of a prior art arrangement for protecting the microphone against disturbances.
Figure 2:
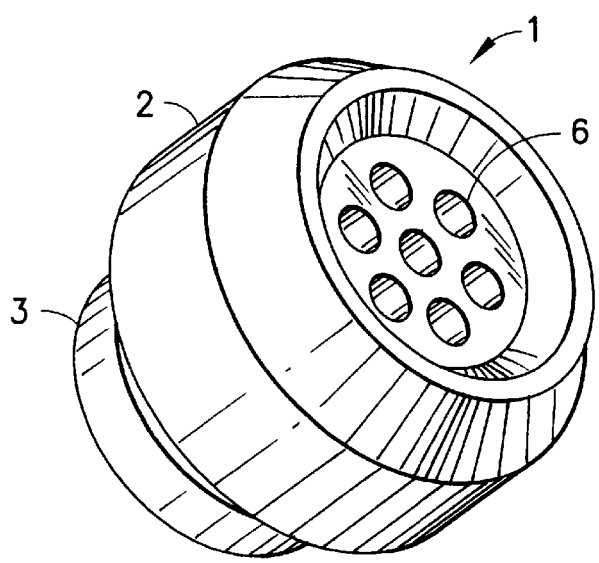
FIG. 2 shows the disturbance eliminator according to the invention as a perspective drawing.
Figure 3:
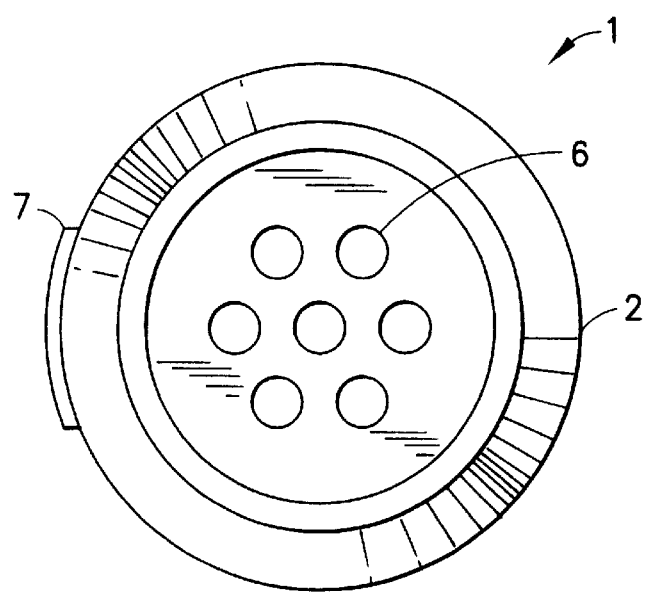
FIG. 3 shows the disturbance eliminator according to FIG. 2 from the front of the microphone.
Figure 4:
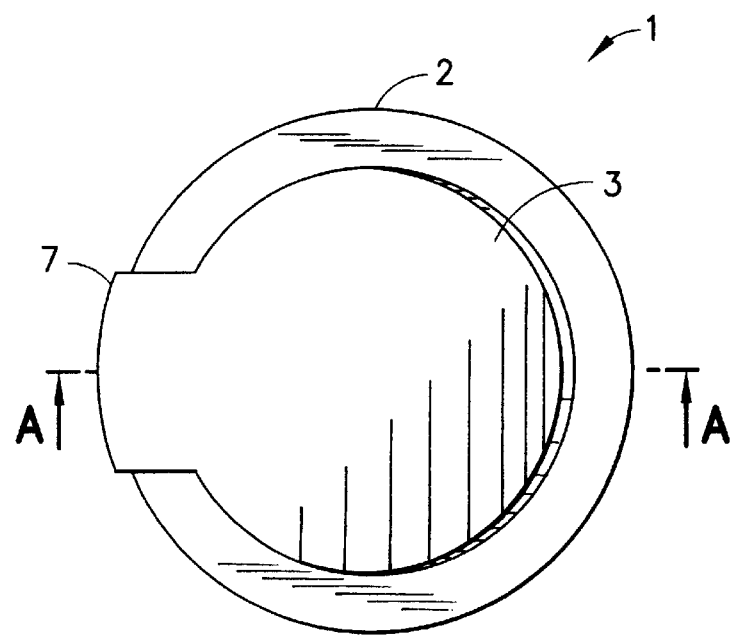
FIG. 4 shows the disturbance eliminator according to the invention from the back.

A disturbance eliminator according to the invention is shown in the FIGS. 2 to 6. The eliminator consists of a casing 1, the wall 8 of which comprises at least two layers of elastic material, 81 and 82. The first layer 81 is of insulating material and the second layer 82 is of conducting material. The insulating layer 81 forms the inner layer of the wall 8 and the second conducting layer 82 forms the outer layer of the wall 8. In this case, the outer surface of the casing is of electrically conducting material.

The casing 1 of the disturbance eliminator consists of two parts: the cage 2 and the lid 3. The cage 2 incorporates a microphone space 4. The microphone 15 is fitted in the microphone space 4 through the installation opening 5 of the cage 2. The opening 5 can be closed with the lid 3 after the microphone 15 has been installed.

The casing 1 also comprises a connection piece 7. By means of this the lid 3 is connected to the cage 2. Thus the cage 2, the lid 3 and the connection piece 7 form a solid body of the same material. The connection piece 7 operates as the hinge of the lid 3 when the lid is opened and closed.

The casing 1 of the disturbance eliminator also comprises sound apertures 6. These apertures are fitted on the front of the casing 1. Through the sound openings 6 the sound is conducted to the microphone 15 fitted in the microphone space 4 of the casing 1 of the disturbance eliminator.

Figure 5:
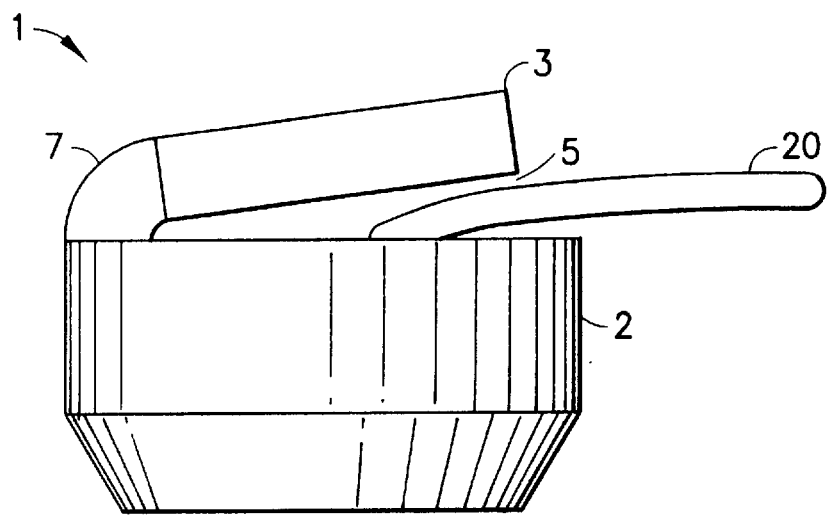
FIG. 5 shows the disturbance eliminator according to the invention from the side.
Figure 6:
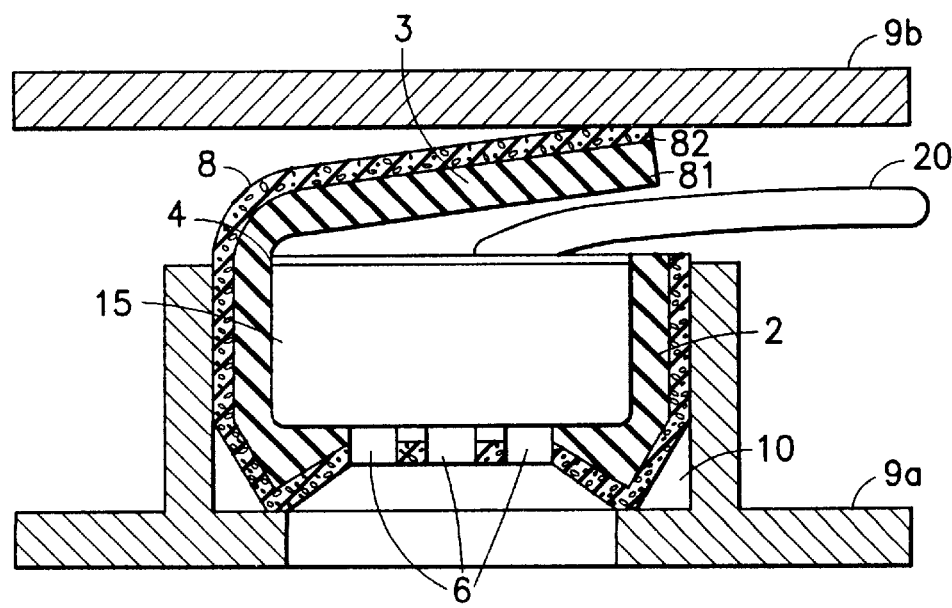
FIG. 6 shows a cross-section A—A of the disturbance eliminator according to FIG. 2; and A prior art arrangement for protecting a microphone against disturbances is shown in FIG. 1. The arrangement comprises a frame 12 and screen 13 fitted in a protective housing 11, which are of electrically conducting material, such as metal. The arrangement also comprises a seal 14 and a rubber sheathing 16 of the microphone 15. The microphone 15 is placed in the rubber sheathing 16 and fitted in the frame 12. The microphone 15 together with the rubber sheathing 16 is pressed into the frame 12 together with the apparatus cover 17 and the seal 14 and the screen 13 fitted between the apparatus cover 17 and the protective housing 11. Thus the protective housing 11, the frame 12 and the screen 13 form an electrically uniform protection around the microphone 15.

The wires 20 of the microphone 15 fitted in the casing 1 of the disturbance eliminator are arranged to run between the cage 2 and the lid 3, as shown graphically in the FIGS. 5 and 6.

The walls 8 of the different parts of the casing 1 of the disturbance eliminator, namely the cage 2, the lid 3 and the connection piece 7 are of elastic material, such as rubber or silicone rubber. The wall 8 of the casing consists of two layers; it has a first, internal layer 81 of insulating material and a second, external layer 82 of conducting material. Both layers 81, 82 are preferably of silicone rubber, which is insulating material as such. The insulating material of the second layer is made conductive by adding extra material to it, such as silver glass balls, nickel or various blends of carbon.

In FIG. 6, the microphone 15, encased in the disturbance eliminator shown in FIGS. 2 to 5, has been installed in an apparatus, such as a mobile station. The microphone 15 in the casing 1 of the disturbance eliminator has been fitted in the installation recess 10, which is part of the apparatus.

The frame parts 9a and/or 9b of the apparatus are electrically conducting at least at the installation recess 10 of the frame part 9a due to the choice of material or coating. The casing 1 of the disturbance eliminator is of elastic material. The external diameter of the casing 1 is preferably a little larger than the internal diameter of the installation recess 10. The conducting external layer 82 is pressed on the frame 9a and/or 9b of the apparatus and forms a conducting contact between the casing 1 and the frame 9a and/or 9b. The casing 1, pressed in the installation recess 10 and incorporating the microphone 15, also seals the apparatus from dust and moisture. Alternatively, the contact is formed between the conducting external layer 82 of the cage 2 and the frame part 9a or between the conducting external layer 82 of the lid 3 and the frame part 9b or even between all these parts. The electromagnetically coupled EMC disturbances are thus conducted via the conducting layer 82 of the casing 1 of the disturbance eliminator to the frame parts 9a and 9b of the apparatus.

The casing 1 can be a separate part or constructional part of the frame 9a of the apparatus.

The various blends of silicone rubber used in the disturbance eliminator have been measured in order to determine their suitability for the insulating and the conducting layer. With measurement at a temperature of 100° C., the following results have been obtained with various blends. When the insulating, unblended material is pure silicone rubber, its elongation is 400%. For silicone rubber blended with carbon, the elongation is 100% and the volume resistivity 4–6 Ω/cm. For silicone rubber blended with silver glass, the elongation is 150% and the volume resistivity 0.01 Ω/cm. For silicone rubber blended with a nickel-graphite alloy, the elongation is 300% and the volume resistivity 0.05 Ω/cm. Silicone rubber, which has been made conductive by blending, preferably contains 50–80% of added, conductive material.

From the values given above, it can be concluded that the materials mentioned are suitable for manufacturing a disturbance eliminator according to the invention. From the elongation values it can be seen that the materials are elastic. Of the conducting blends, the silver-glass and nickel-graphite blends have been found to have the best electromagnetic protection because of their low resistivity.

Some applications of the invention have been described above. The invention is naturally not limited to the above examples only, but it can be modified within the scope defined by the attached claims.

What is claimed is:

1. A disturbance eliminator particularly for a microphone, characterized in that the disturbance eliminator comprises a casing (1) having at least one aperture for sound and at least one aperture for wiring means, a wall (8) of said casing including at least two layers of material (81, 82) in a contiguous relationship throughout said casing, of which a first layer (81) is of insulating material and a second layer (82) is of electrically conducting material and said materials of said first layer and of said second layer are flexible.

2. A disturbance eliminator according to claim 1, characterized in that said conducting layer (82) of said wall (8) forms an external layer of said casing (1).

3. A disturbance eliminator according to claim 2, characterized in that said second layer of electrically conducting material (82) of said wall (8) is electrically coupled to a frame (9a) of an apparatus by fitting the microphone (15) in said casing (1) of the disturbance eliminator into an installation recess (10) for said apparatus.

4. A disturbance eliminator according to claim 2, characterized in that said casing (1) comprises at least two parts: a cage (2) and a lid (3), which cage (2) has a microphone space (4) for the microphone (15) and which microphone space (4) can be closed with said lid (3).

5. A disturbance eliminator according to claim 4, characterized in that said casing (1) includes a connection piece (7), by which said lid (3) is connected to said cage (2), which cage (2), lid (3) and connection piece (7) form a solid body.

* * * * *